(12) United States Patent
Liu et al.

(10) Patent No.: US 7,596,158 B2
(45) Date of Patent: Sep. 29, 2009

(54) METHOD AND STRUCTURE OF GERMANIUM LASER ON SILICON

(75) Inventors: Jifeng Liu, Cambridge, MA (US); Dong Pan, Andover, MA (US); Lionel C. Kimerling, Concord, MA (US); Jurgen Michel, Arlington, MA (US); Sajan Saini, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/553,141

(22) Filed: Oct. 26, 2006

(65) Prior Publication Data

US 2007/0105251 A1  May 10, 2007

Related U.S. Application Data

(60) Provisional application No. 60/731,545, filed on Oct. 28, 2005.

(51) Int. Cl.
*H01S 5/00* (2006.01)
(52) U.S. Cl. ................................. 372/43.01; 372/45.01
(58) Field of Classification Search .............. 372/43.01, 372/45.01
See application file for complete search history.

(56) References Cited

U.S. PATENT DOCUMENTS

| | | | |
|---|---|---|---|
| 5,548,128 A | 8/1996 | Soref et al. | |
| 5,883,912 A * | 3/1999 | Ramdani et al. | 372/45.01 |
| 6,151,347 A * | 11/2000 | Noel et al. | 372/45.01 |
| 6,621,841 B1* | 9/2003 | Soref et al. | 372/43.01 |
| 6,812,495 B2 | 11/2004 | Wada et al. | |
| 6,946,318 B2 | 9/2005 | Wada et al. | |
| 2005/0082554 A1 | 4/2005 | Torvik | |

FOREIGN PATENT DOCUMENTS

| | | | |
|---|---|---|---|
| JP | 07249833 | * | 9/1995 |
| WO | WO 2005/010965 | | 2/2005 |

OTHER PUBLICATIONS

J.R. Haynes et al., "The Direct Radiative Transitions in Germanium and Their Use in the Analysis of Lifetime" Radiative Recombination in semiconductors, Part of Proceedings of VIIth International Conference on Physics of Semiconductor, Paris 1964 p. 21-31.
O. Madelung-Landolt-Bornstein, "Semiconductors: Intrinsic Properties of Group IV Elements and III-V, II-V, and I-VII Compounds" Group III, vol. 22, 1987, Berlin, p. 275.

* cited by examiner

*Primary Examiner*—Dung T Nguyen
(74) *Attorney, Agent, or Firm*—Gauthier & Connors LLP

(57) ABSTRACT

A laser structure includes at least one active layer having doped Ge so as to produce light emissions at approximately 1550 nm from the direct band gap of Ge. A first confinement structure is positioned on a top region of the at least one active layer. A second confinement structure is positioned on a bottom region the at least one active layer.

25 Claims, 6 Drawing Sheets

METHOD AND STRUCTURE OF GERMANIUM LASER ON SILICON

PRIORITY INFORMATION

This application claims priority from provisional application Ser. No. 60/731,545 filed Oct. 28, 2005, which is incorporated herein by reference in its entirety.

BACKGROUND OF THE INVENTION

The invention relates to the field of Ge lasers, and in particular to a laser structure obtaining efficient light emission at around 1550 nm from the direct band gap of Ge.

An efficient laser source on Si is the most crucial device to achieve optoelectronic integrated circuit (OEIC) on Si. Although research on this field has been continued for over two decades, no efficient electrically pumped laser has been demonstrated on Si yet. Therefore, it is of great significance to achieve an efficient, electrically pumped light source on Si platform. Further more, it would be ideal if the light source emits at a wavelength around 1550 nm so that the on-chip optical signals can be easily hooked up with long haul telecommunications.

Germanium is a pseudo-direct band gap material in that the difference between its direct and indirect gap is only 0.136 eV. What is more intriguing is that the direct gap of Ge is 0.8 eV, exactly corresponding to 1550 nm. High efficiency Ge photodetectors on Si in this wavelength range have been demonstrated due to the absorption of this direct band gap.

SUMMARY OF THE INVENTION

According to one aspect of the invention, there is provided a laser structure. The laser structure includes at least one active layer comprising doped Ge so as to produce light emissions at approximately 1550 nm from the direct band gap of Ge. A first confinement structure is positioned on a top region of the at least one active layer. A second confinement structure is positioned on a bottom region of the at least one active layer.

According to one aspect of the invention, there is provided a method of forming a laser structure. The method includes forming at least one active layer comprising doped Ge so as to produce light emissions at approximately 1550 nm from the direct band gap of Ge. A first confinement structure is positioned on a top region of the at least one active layer. Also, the method includes forming a second confinement structure being positioned on a bottom region of the at least one active layer.

DETAILED DESCRIPTION OF THE INVENTION

The invention provides a technique to obtain efficient light emission at around 1550 nm from the direct band gap of Ge.

Figure 1:
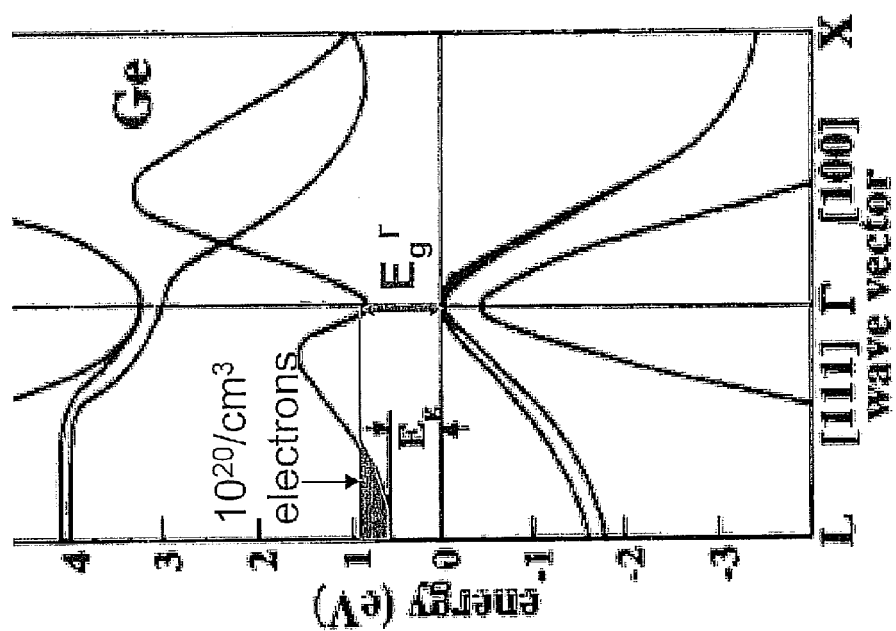
FIG. 1 is a graph illustrating the band structure of Ge.

The band structure of Ge is shown in FIG. 1, with the indirect band gap at the L valley and direct gap at $\Gamma$ valley. To compensate for the 0.136 eV difference between L and $\Gamma$ valleys, we can fill $1 \times 10^{20}/cm^3$ electrons into the conduction band at L valley by heavily n-type doing. Then when carriers are injected into this $n^+$ Ge material, electrons will have to populate $\Gamma$ valley and then recombine with holes via this direct band gap transition, which emits light at 1550 nm. In other words, $n^+$ Ge with doping concentration greater than $10^{20}/cm^3$ is effectively a direct band gap material. This is the basic principle of our Ge laser on Si.

The difference between $\Gamma$ and L valley can be further decreased by introducing tensile strain into Ge layer by the thermal expansion mismatch between Ge and Si, as has already been demonstrated in tensile strained Ge photodetectors on Si. By introducing 0.25% tensile strain into Ge, the difference between L and $\Gamma$ valley can be decreased to 0.112 eV, and the n-type doping density needed to start filling $\Gamma$ valley is reduced to $6.7 \times 10^{19}/cm^3$. With less free carriers in the conduction band the free carrier absorption is reduced, so is the threshold current density for lasing.

Figure 2:
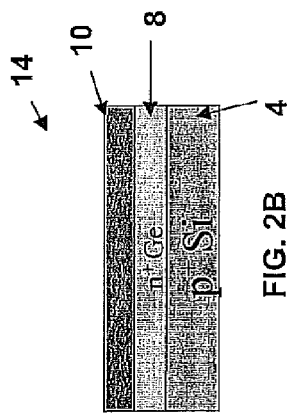
FIG. 2 is a schematic diagram illustrating a lateral emission double hetero-junction (DH) Ge laser on Si.
Figure 2:
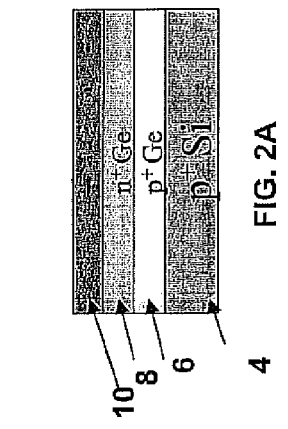
Figure 2:
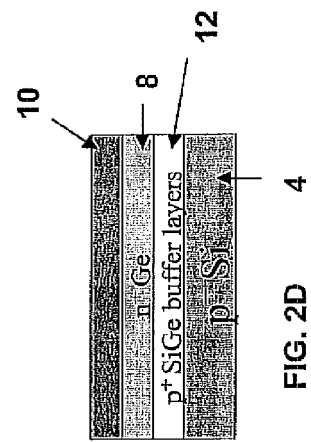
Figure 2:
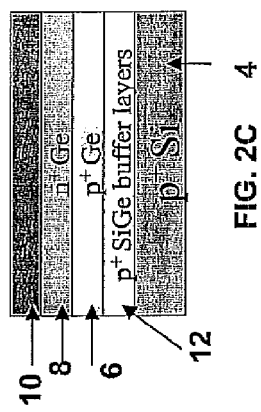

Double hetero-junction (DH) structures of Ge laser diodes 2 on Si are shown in FIGS. 2A-2D. A $p^+$ single crystalline Si layer on a Si substrate 4 or SOI substrate is provided, as shown in FIG. 2A. A thin $p^+$ Ge layer 6 is grown on the $p^+$ Si epitaxially by ultrahigh-vacuum chemical vapor deposition (UHV-CVD), metal-organic chemical vapor deposition (MOCVD), low pressure chemical vapor deposition (LPCVD) or molecular beam epitaxy (MBE). Then an epitaxial $n^+$ Ge layer 8 with a doping concentration in the $10^{19}$-$10^{20}/cm^3$ range is grown on top of this $p^+$ Ge layer 6. The doping can be achieved either in situ during the Ge growth or by ion implantation. The Ge material can be annealed to decrease the defect density and increase the tensile strain. An $n^+$ layer 10 of any semiconductor material that provides electron confinement in Ge layers is grown on top of the $n^+$ Ge layer 8. The material for this carrier confinement layer 10 can be, for example, Si (with adequate interface engineering), SiGe alloy with adequate composition (one example is $Si_{0.15}Ge_{0.85}$), nanocrystalline Si, GaAs or AlGaAs.

In FIG. 2A, the Ge layers 8 and 6 act as the active lasing material, while the materials on top 10 and bottom 4 of the $n^+$ Ge layer 8 and $p^+$ Ge layer 6 provide carrier and photon confinement due to the band offset and lower refractive index compared to Ge. The $p^+$ Ge layer 6 is optional in the device structure 2. A structure 14 without the $p^+$ Ge layer 6 is shown in FIG. 2B. SiGe buffer layers 12 with heavy p-type doping can be inserted between the $p^+$ Si substrate 4 and pure p+ Ge layer 6, as shown in FIGS. 2C-2D.

Figure 3B:
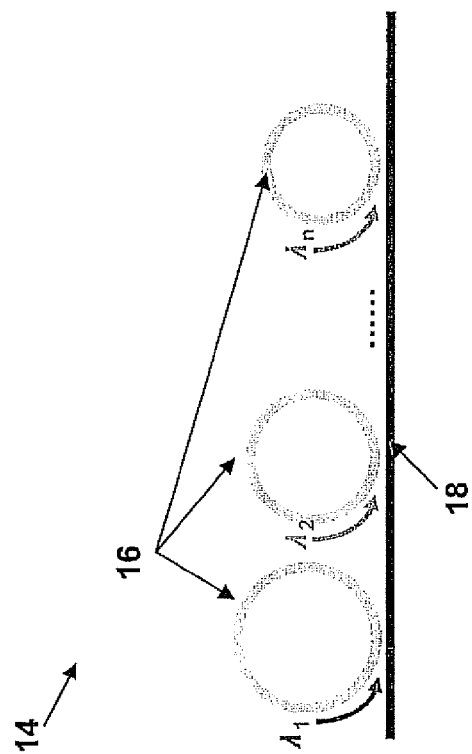
FIG. 3B is a schematic diagram of a ring laser structure to implement wavelength division multiplexing.
Figure 3A:
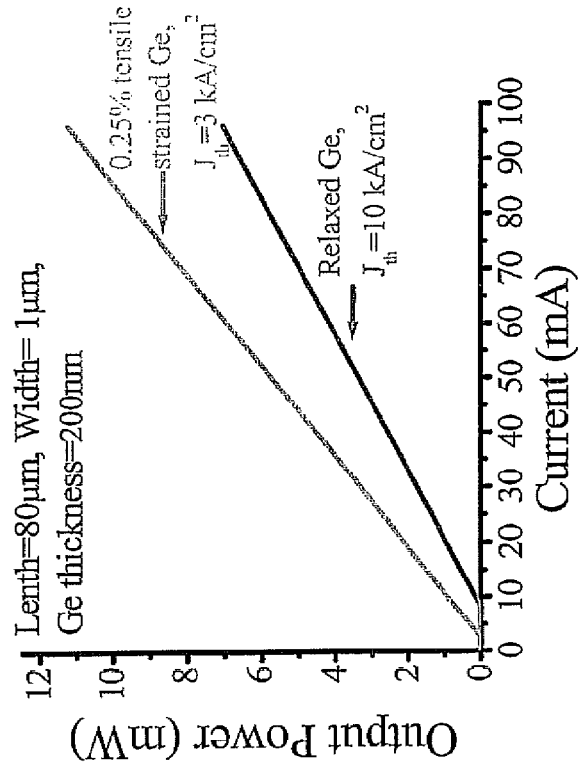
FIG. 3A is a graph illustrating the calculated light emission intensity vs. injection current (L-I) curve for relaxed and tensile strained Ge material on Si.

The whole structure forms a lateral emission laser diode, which could be a ridge waveguide, channel waveguide or ring structure. As an example, the calculated light emission intensity vs. injection current (L-I) curve is shown in FIG. 3A. The threshold current of 0.25% tensile strained Ge laser is determined to be 3 kA/cm², and the overall efficiency can reach >10%, which is comparable to III-V laser devices. FIG. 3B shows an example of Ge ring lasers coupled with low loss waveguides 14. With Ge rings 16 of different diameters, multiple emitting wavelengths can be coupled into the same waveguide 18 to achieve wavelength division multiplexing (WDM).

Figure 4:
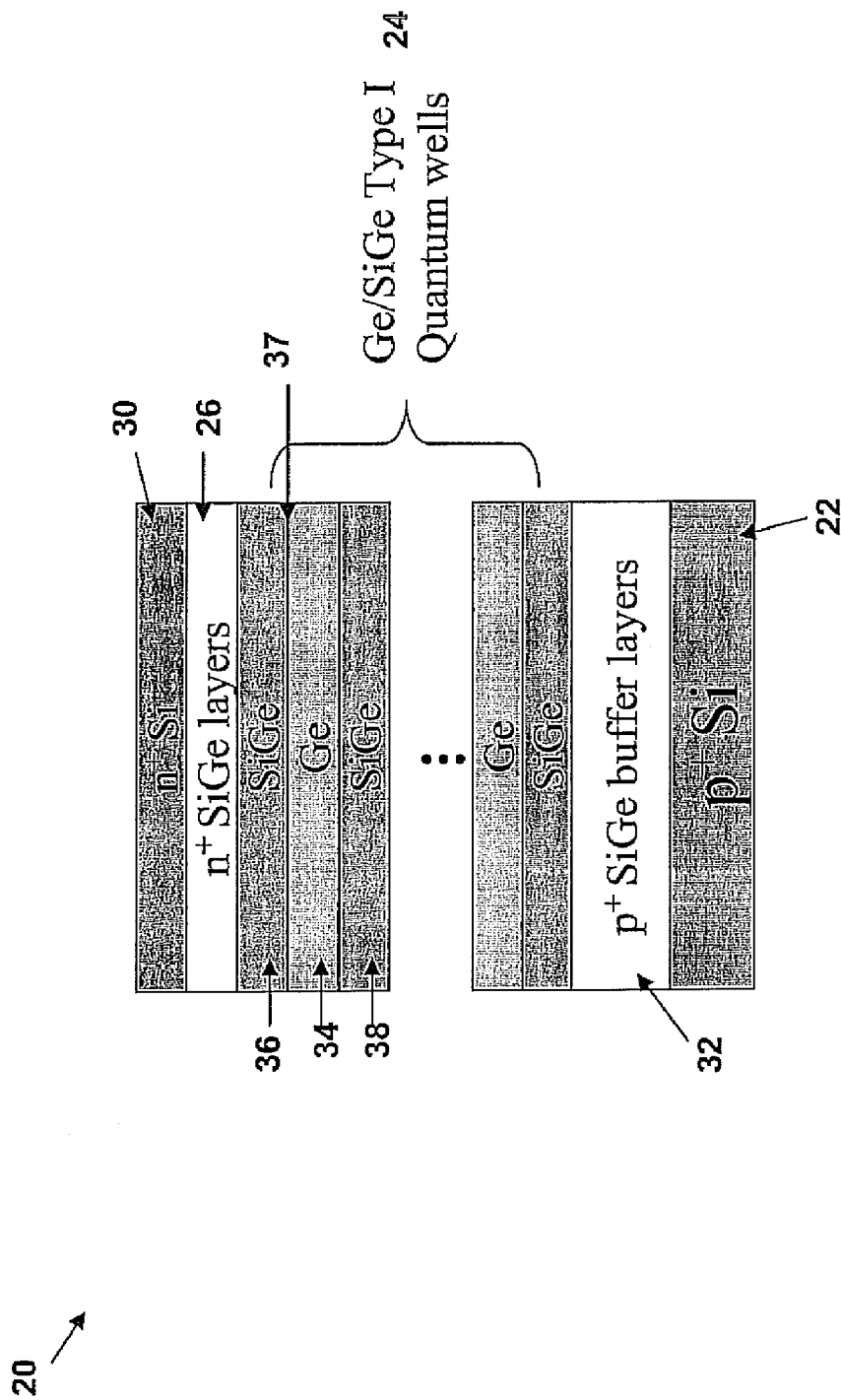
FIG. 4 is a schematic diagram illustrating a quantum well Ge laser on Si.

Quantum well (QW) structures of a Ge laser 20 on Si are shown in FIG. 4. The laser 20 includes a p⁺ Si substrate 22. A stack of p⁺ SiGe buffer layers 32 is formed on the substrate 22. Quantum wells (QWs) 24 are formed on the buffer layer 32. Note each QW 37 includes a Ge layer 34 that is formed in between SiGe layers 36, 38. A stack of n+ SiGe layers 26 is formed on the quantum wells 24. An n⁺ Si layer 30 is formed on the n+ SiGe layers 26.

In this case, the SiGe thin film layers 36, 38 with adequate composition (for example, $Si_{0.15}Ge_{0.85}$) provide carrier confinement in the Ge layers 34. These barrier layers can be substituted with any epitaxial semiconductor material that provides carrier confinement in the Ge layers 34, like Si (with adequate interface engineering), GaAs or AlGaAs. As the density of states in Ge QWs is much less than in bulk Ge, the threshold current density for lasing can be further decreased, which is very beneficial for on-chip applications.

Figure 5:
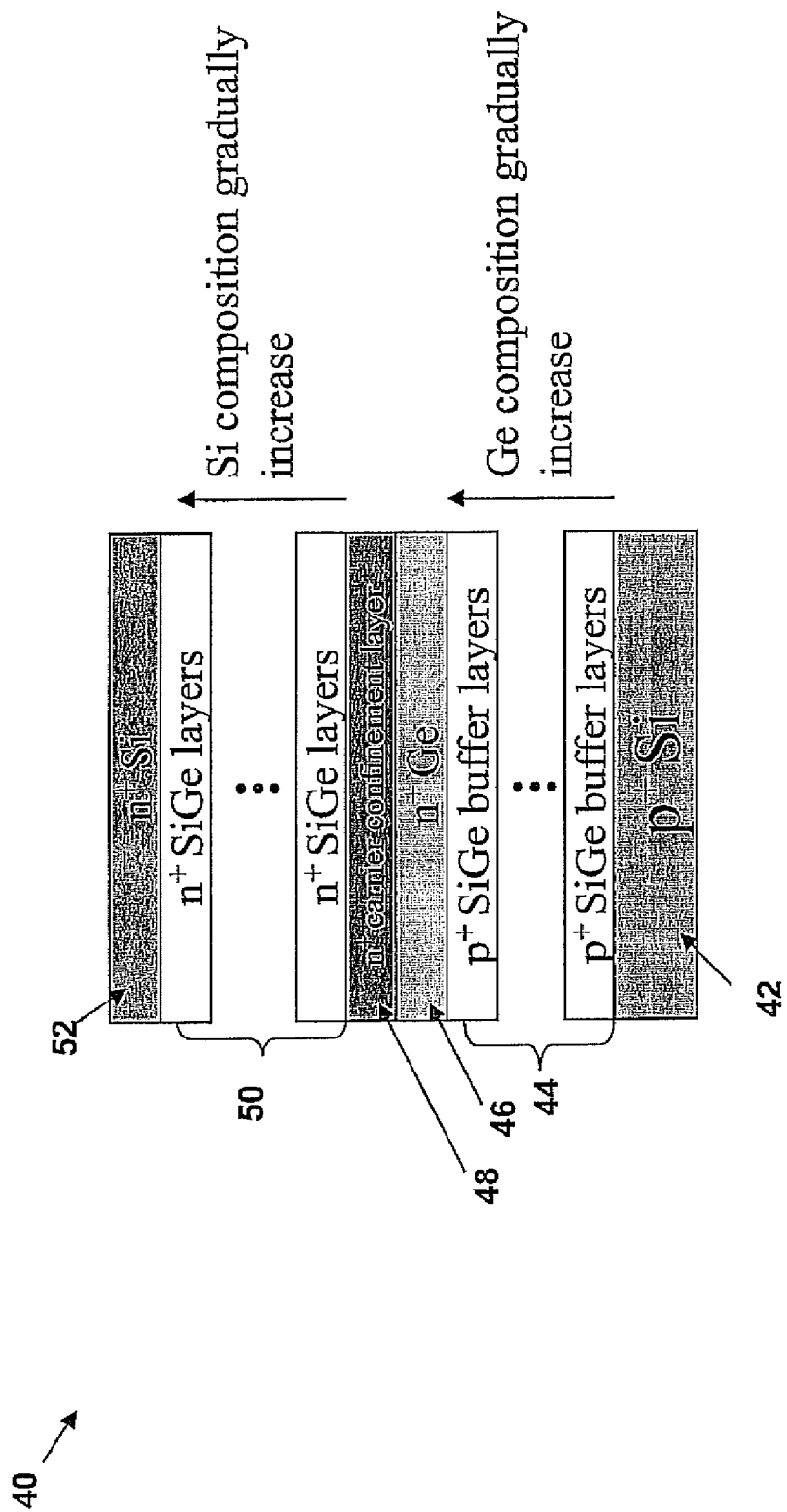
FIG. 5 is a schematic diagram illustrating a vertical cavity surface emission Ge laser (VCSEL) on Si.

A vertical cavity surface emission laser (VCSEL) 40 can also be achieved by using vertical diffracted Bragg reflectors (DBR), as shown in FIG. 5. The laser 40 includes a p⁺ Si substrate 42 where p⁺ SiGe buffer layers 44 are formed. A n⁺ Ge active layer 46 is formed on the buffer layers 44. A n⁺ carrier confinement layer 48 is formed on the active layer 46. A number of n⁺ SiGe layers 50 are formed on the n⁺ carrier confinement layer 48. A n⁺ Si layer 52 is formed on the buffer layers 50.

The SiGe graded buffer layers 44 and 50 have a λ/4 thickness in each layer (λ refers to the wavelength in each layer), which serve as the bottom 44 and top DBR 50. The buffer layer composition is designed such that the top layer 52 and bottom substrate 42 of the device 40 are both Si material so that regular metal contacts in Si CMOS technology can be applied. In this case, the confinement layer 48 can be n⁺ Si, n⁺ SiGe, n⁺ GaAs or any other semiconductor material that confines electrons in Ge layers. Layer 48 also has a thickness of λ/4. The active Ge layer 46 should be λ/2 in thickness.

Figure 6:
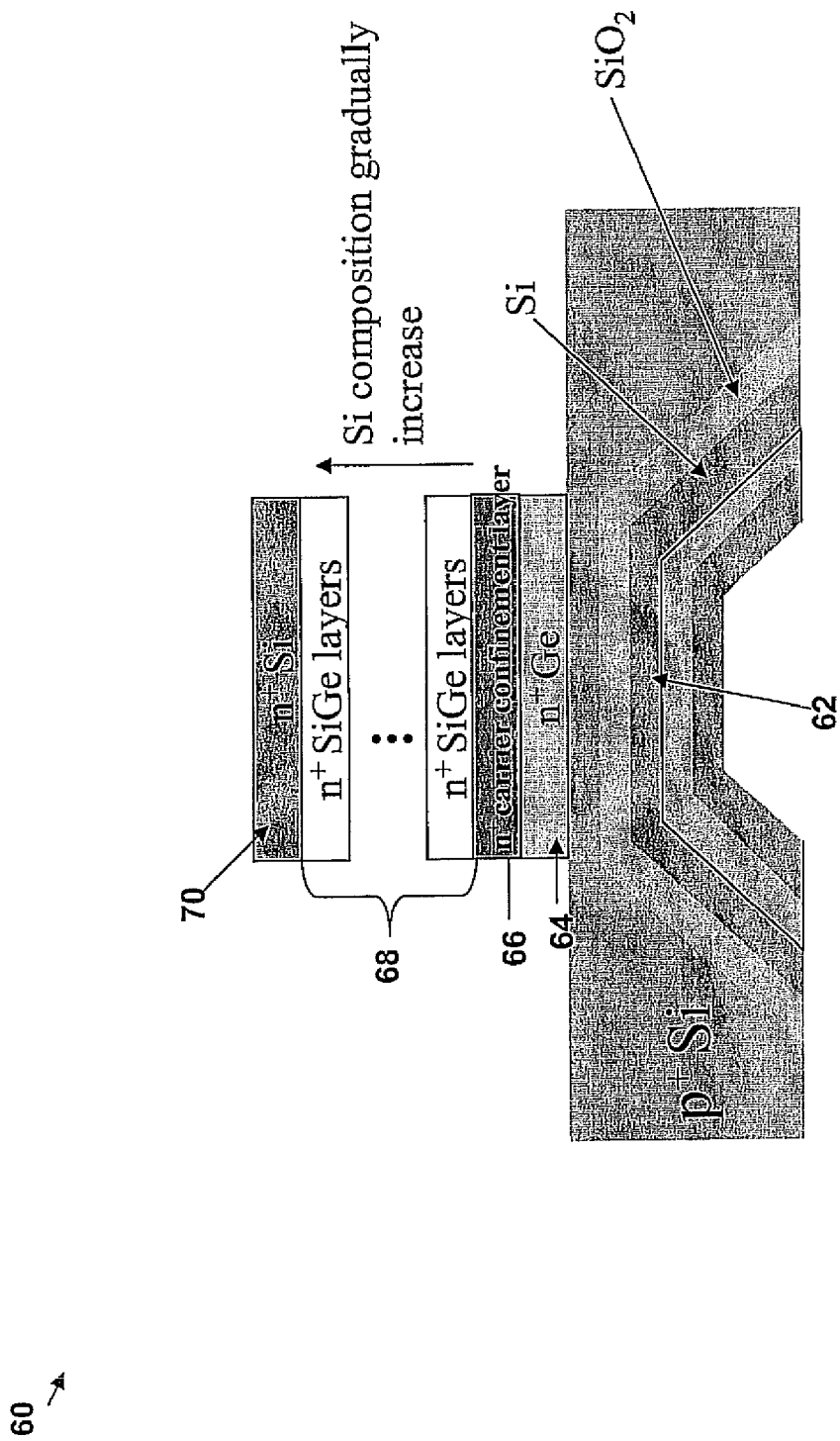
FIG. 6 is a schematic diagram illustrating another embodiment a vertical cavity surface emission Ge laser (VCSEL) on Si.

An alternative example of a VCSEL 60 is shown in FIG. 6, where the bottom DBR 62 is consisted of λ/4 $SiO_2$/Si multi layers deposited on an etched recess on the backside of the wafer. Note the structure includes an active Ge layer 64 that is formed on the bottom DBR 62. A carrier confinement layer 66 is formed on the active Ge layer 64, and it can be Si, SiGe alloy with adequate composition (one example is $Si_{0.15}Ge_{0.85}$), nanocrystalline Si, GaAs or AlGaAs. Buffer layers 68 are formed on the confinement layer 66, and include n⁺ SiGe layers. An n⁺ Si layer 70 is formed on the buffer layers 68. The materials of the bottom DBR 62 are not restricted to what is described above. It could be any two materials with different refractive index.

The active materials in the laser structures described herein are not restricted to n⁺ and p⁺ Ge. Intrinsic, n and p-type Ge, SiGe, GeSn and any other semiconductor material with the direct band gap lower or not too much higher than the indirect band gap can all emit light from the direct gap transitions at high enough carrier injection level, or by loading electrons into the Γ valley directly through some resonant tunneling process. The structure of the active region can also be quantum wells or quantum dots of these materials.

The laser structures described herein can be integrated with other electronic and optoelectronic components in a Si ultralarge-scale integrated circuit (ULSI), and has broad applications in areas like on-chip, chip-to-chip and board-to-board optical interconnection with a bandwidth exceeding 10 GHz, as well as fiber to the home (FTTH) for >10 Gb/s ultra high speed network. This near infrared light source could also be applied to medical applications.

Although the present invention has been shown and described with respect to several preferred embodiments thereof, various changes, omissions and additions to the form and detail thereof, may be made therein, without departing from the spirit and scope of the invention.

What is claimed is:

1. A laser structure comprising:
at least one active layer including doped Ge so as to produce light emissions at approximately 1550 nm from the direct band gap of Ge, said doped Ge having an n⁺ doping concentration of at least $1 \times 10^{19}$ cm$^{-3}$;
a first confinement structure being positioned on a top region of said at least one active layer, said first confinement structure comprises materials that provide carrier confinement in said at least one active layer; and
a second confinement structure being positioned on a bottom region of said at least one active layer and comprising p⁺ Si or n⁺ Si, said second confinement structure comprises multilayers of two materials with different refractive indexes to form a diffracted Bragg reflector.

2. The laser structure of claim 1, wherein said at least one active layer comprises n⁺ Ge.

3. The laser structure of claim 1, wherein said at least one active layer comprises p⁺ Ge.

4. The laser structure of claim 1, wherein said at least one active layer comprise intrinsic, n and p-type Ge, SiGe, GeSn.

5. The laser structure of claim 1, wherein said materials in said first confinement structure comprise Si, nanocrystalline Si, SiGe, GaAs or AlGaAs.

6. The laser structure of claim 1, wherein said first confinement structure comprises SiGe.

7. The laser structure of claim 1, wherein said second confinement structure comprises SiGe.

8. The laser structure of claim 1, wherein said laser structure comprises a lateral emission device of channel waveguide, ridge waveguide or ring structure.

9. The laser structure of claim 8, wherein said laser structure comprises Ge ring lasers with different radii emitting at different wavelengths and couple to waveguides for wavelength division multiplexing.

10. The laser structure of claim 1, wherein said laser structure comprises a vertical cavity surface emission structure.

11. A laser structure comprising:
at least one active layer including doped Ge so as to produce light emissions at approximately 1550nm from the direct band gap of Ge, said doped Ge having an n⁺ doping concentration of at least $1 \times 10^{19}$ cm$^{-3}$;
a first confinement structure being positioned on a top region of said at least one active layer, said first confinement structure comprises materials that provide carrier confinement in said at least one active layer; and
a second confinement structure being positioned on a bottom region of said at least one active layer, said second confinement structure comprises $SiO_2$/Si multi layers deposited on an etched recess on the backside of a wafer to form a diffracted Bragg reflector.

12. The laser structure of claim 11, wherein said second confinement structure comprise multilayers of two materials with different refractive indexes to form a diffracted Bragg reflector.

13. A method of forming a laser structure comprising:
forming at least one active layer including doped Ge so as to produce light emissions at approximately 1550nm from the direct band gap of Ge, said doped Ge having an n⁺ doping concentration of at least $1 \times 10^{19}$ cm$^{-3}$;

forming a first confinement structure being positioned on a top region of said at least one active layer, said first confinement structure comprises materials that provide carrier confinement in said at least one active layer; and forming second confinement structure being positioned on a bottom region of said at least one active layer and comprising $p^+$ Si, said second confinement structure comprise multilayers of two materials with different refractive indexes to form a diffracted Bragg reflector.

14. The method of claim 13, wherein said at least one active layer comprises $n^x$ Ge.

15. The method of claim 13, wherein said at least one active layer comprises $p^x$ Ge.

16. The method of claim 13, wherein said at least one active layer comprises intrinsic, n and p-type Ge, SiGe, or GeSn.

17. The method of claim 13, wherein said materials in said first confinement structure comprise Si, nanocrystalline Si, SiGe, GaAs or AlGaAs.

18. The method of claim 13, wherein said first confinement structure comprises SiGe.

19. The method of claim 13, wherein said second confinement structure comprises SiGe.

20. The method of claim 13, wherein said laser structure comprises a lateral emission device of channel waveguide, ridge waveguide or ring structure.

21. The method of claim 20, wherein said laser structure comprises Ge ring lasers with different radii emitting at different wavelengths and couple to waveguides for wavelength division multiplexing.

22. The method of claim 13, wherein said laser structure comprises a vertical cavity surface emission structure.

23. A method of forming a laser structure comprising:

forming at least one active layer including doped Ge so as to produce light emissions at approximately 1550 nm from the direct band gap of Ge, said doped Ge having an $n^+$ doping concentration of at least $1\times10^{19}$ cm$^{-3}$;

forming a first confinement structure being positioned on a top region of said at least one active layer, said first confinement structure comprises materials that provide carrier confinement in said at least one active layer; and forming second confinement structure being positioned on a bottom region of at least one active layer said second confinement structure comprises $SiO_2$/Si multi layers deposited on an etched recess on the backside of a wafer.

24. The method of claim 23, wherein said second confinement structure comprises multilayers of two materials with different refractive indexes to form a diffracted Bragg reflector.

25. The method of claim 13, wherein said first confinement structure comprises buffer layers having n+ SiGe buffer layers.

* * * * *